US012658924B2

(12) United States Patent
Singh et al.

(10) Patent No.: US 12,658,924 B2
(45) Date of Patent: Jun. 16, 2026

(54) LOW LATENCY RESET SYNCHRONIZER CIRCUIT

(71) Applicant: STMicroelectronics International N.V., Geneva (CH)

(72) Inventors: Rupesh Singh, Ghaziabad (IN); Ankur Bal, Greater Noida (IN); Kirtiman Singh Rathore, Noida (IN)

(73) Assignee: STMicroelectronics International N.V., Geneva (CH)

( * ) Notice: Subject to any disclaimer, the term of this patent is extended or adjusted under 35 U.S.C. 154(b) by 120 days.

(21) Appl. No.: 18/623,331

(22) Filed: Apr. 1, 2024

(65) Prior Publication Data

US 2024/0364347 A1 Oct. 31, 2024

Related U.S. Application Data

(60) Provisional application No. 63/462,274, filed on Apr. 27, 2023.

(51) Int. Cl.
| | |
|---|---|
| *H03K 3/02* | (2006.01) |
| *H03K 3/037* | (2006.01) |
| *H03K 5/1534* | (2006.01) |
| *H03K 19/20* | (2006.01) |
| *H03L 7/00* | (2006.01) |

(52) U.S. Cl.
CPC .............. *H03L 7/00* (2013.01); *H03K 3/037* (2013.01); *H03K 5/1534* (2013.01); *H03K 19/20* (2013.01)

(58) Field of Classification Search
CPC .......... H03K 3/02; H03K 3/027; H03K 3/037; H03K 3/0375; H03K 5/153; H03K 5/1534; H03K 19/02; H03K 19/173; H03K 19/20; H03L 7/00
See application file for complete search history.

(56) References Cited

U.S. PATENT DOCUMENTS

| | | | | |
|---|---|---|---|---|
| 7,366,938 | B2 | 4/2008 | Warren et al. | |
| 7,366,943 | B1 | 4/2008 | Owen | |
| 8,867,684 | B2 | 10/2014 | Dahan | |
| 9,197,211 | B2 | 11/2015 | Venas | |
| 11,177,799 | B2 * | 11/2021 | Bal ...................... | H03K 17/162 |
| 2009/0153202 | A1 * | 6/2009 | Yagi ...................... | H03K 5/135 |
| | | | | 327/141 |
| 2010/0322365 | A1 | 12/2010 | Dobkin et al. | |

* cited by examiner

*Primary Examiner* — Long Nguyen
(74) *Attorney, Agent, or Firm* — Crowe & Dunlevy LLC

(57) ABSTRACT

A first latching circuit has a reset function controlled by a reset signal and configured to latch a logic state in response to a first edge of a clock signal to generate a first output signal. A second latching circuit has a reset function controlled by that reset signal and configured to latch a logic state in response to a second edge of that clock signal to generate a second output signal. The first and second edges are opposite edges. A combinatorial logic circuit logically combines the first and second output signals to generate a logic output signal. A third latching circuit has a reset function controlled by that reset signal and configured to latch the logic output signal in response to the second edge of that clock signal to generate a reset synchronization control signal.

19 Claims, 5 Drawing Sheets

LOW LATENCY RESET SYNCHRONIZER CIRCUIT

CROSS REFERENCE TO RELATED APPLICATIONS

This application claims priority from United States Provisional Application for Patent No. 63/462,274, filed Apr. 27, 2023, the disclosure of which is incorporated herein by reference.

TECHNICAL FIELD

The present invention generally relates to the synchronization of asynchronous signals.

BACKGROUND

Reference is now made to FIG. 1 which shows a high-level block diagram of a high-speed physical (PHY) layer 100 of a portion of a communications network. In this example, the PHY layer 100 supports communications over multiple data communications channels 102(1) and 102(2); it will be noted that two channels are shown just by way of a non-limiting example. A serializer circuit 104 is provided for each data communications channel 102, with the serializer circuit functioning to convert parallel data (DATA) received over a multi-bit input bus 106(1), 106(2) to a serial data stream (SDS) for output over a corresponding serial data line 108(1), 108(2).

In multi-channel PHY layers 100 like that shown in FIG. 1, controlling reset synchronization between the serializer circuits 104 of the data communications channels 102(1), 102(2) is critical in order to avoid issues with inter-channel data skew. Each serializer circuit 104 is reset by a reset control signal 110. To ensure that there is no inter-channel data skew, assertion of the reset control signals 110 should be synchronized to the edge of a clock signal (CLK). Each reset control signal 110 is generated by a reset synchronization circuit 112 in response to assertion of a master reset signal (Reset) and an edge of the clock signal (CLK).

Reference is now made to FIG. 2 which shows a block diagram of a prior art reset synchronization circuit 212 which is known for use as the reset synchronization circuit 112 in a communications network like that shown in FIG. 1. The reset synchronization circuit 212 is formed by the series connection of a plurality of flip-flop circuits 214(1) to 214(N), N being an integer greater than or equal to two. The flip-flop circuits 214 have a clock input configured to receive the clock signal (CLK) and a reset input configured to receive the reset signal (Reset). The data input (D) of the first flip-flop circuit 214(1) is coupled to receive a logic 1 input signal (for example, by being tied to the supply voltage Vdd, for active low reset). The data output of each flip-flop circuit 214 is coupled to the data input of the next flip-flop circuit 214 in the series connection. The data output of the last flip-flop circuit 214(N) provides the reset control signal 110.

The inclusion of multiple flip-flop circuits 214 in the reset synchronization circuit 212 attempts to block a potential metastable condition at a flip-flop caused when a change in state of the reset signal (Reset) occurs substantially simultaneously with an edge of the clock signal (CLK). This condition leads to an unknown and unwanted state situation in the output of the flip-flop circuit 214. The presence of additional flip-flop circuits blocks the metastable signal until the next clock edge.

For a high speed PHY layer 100, a large number of flip-flop circuits 214 are needed in order to reduce the mean time between failure (MTBF). For example, N must be significantly larger than ten.

The increased number of flip-flop circuits 214 that are serially connected in the reset synchronization circuit 212 in this case leads to a further concern in that recovery time from the metastability condition can exceed the duration of a single cycle of the clock (CLK). In such a case, there is a risk that the assertions of the reset control signals 110 for the serializer circuits 104 of the plural data communications channels 102 will not be synchronized to a high speed clock (for example, on the order of a few giga-Hertz), leading to an unwanted data skew between channels.

Reference is now made to FIG. 3 which shows a timing diagram for operation of the PHY layer 100 of FIG. 1 using the prior art reset synchronization circuits 212 of FIG. 2. At time t1, a change in state of the reset signal (Reset) occurs simultaneously with the leading edge of the high speed clock signal (CLK). A first reset synchronization circuit 212 associated with a first data communications channel 102(1) responds to the change in state of the reset signal (Reset) by asserting the reset control signal 110 (CH1) for the serializer circuit 104 of the first data communications channel 102(1) at time t2. In an ideal scenario, the second reset synchronization circuit 212 associated with a second data communications channel 102(2) would also respond to the change in state of the reset signal (Reset) by synchronously asserting the reset control signal 110 (CH2) for the serializer circuit 104 of the second data communications channel 102(2) at time t2. However, due to a metastability condition in one flip-flop circuit 214 of the second reset synchronization circuit 212, there is a delay in assertion of the reset control signal 110 (CH2) for the serializer circuit 104 of the second data communications channel 102(2) until time t3. It will noted here that the recovery time from the metastability condition for the second reset synchronization circuit 212 is much longer than one clock cycle. As a result, there is a data skew between the start of serial data stream (SDS (CH1)) output from the serializer circuit 104 of the first data communications channel 102(1) at time t4 and the start of serial data stream (SDS (CH2)) output from the serializer circuit 104 of the second data communications channel 102(2) at time t5.

SUMMARY

In an embodiment, a reset synchronization circuit comprises: a first latching circuit having a reset function controlled by a reset signal and configured to latch a logic state in response to a first edge of a clock signal to generate a first output signal; a second latching circuit having a reset function controlled by said reset signal and configured to latch a logic state in response to a second edge of said clock signal to generate a second output signal; wherein the first and second edges are opposite edges; a combinatorial logic circuit configured to logically combine the first and second output signals to generate a logic output signal; and a third latching circuit having a reset function controlled by said reset signal and configured to latch the logic output signal in response to said second edge of said clock signal to generate a synchronization control signal.

In an embodiment, a physical layer within a communications network comprises: a first data communications channel having a first serializer circuit with an input coupled to a first data bus and an output coupled to a first serial data line; a second data communications channel having a second serializer circuit with an input coupled to a second data bus and an output coupled to a second serial data line; a first reset synchronization circuit configured to receive a reset signal and a clock signal and having an output configured to generate a first reset control signal applied for controlling resetting of the first serializer circuit; and a second reset synchronization circuit configured to receive said reset signal and said clock signal and having an output configured to generate a second reset control signal applied for controlling resetting of the second serializer circuit.

Each of the first and second reset synchronization circuits comprises: a first latching circuit having a reset function controlled by said reset signal and configured to latch a logic state in response to a first edge of said clock signal to generate a first output signal; a second latching circuit having a reset function controlled by said reset signal and configured to latch a logic state in response to a second edge of said clock signal to generate a second output signal; wherein the first and second edges are opposite edges; a combinatorial logic circuit configured to logically combine the first and second output signals to generate a logic output signal; and a third latching circuit having a reset function controlled by said reset signal and configured to latch the logic output signal in response to said second edge of said clock signal to generate the corresponding one of the first and second reset control signals.

In an embodiment, a reset synchronization method comprises: resetting a first latching circuit in response to a reset signal; latching by the first latching circuit a logic state in response to a first edge of a clock signal; resetting a second latching circuit in response to the reset signal; latching by the second latching circuit a logic state in response to a second edge of the clock signal; wherein the first and second edges are opposite edges; logically combining an output of the first latching circuit with an output of the second latching circuit to generate a logic output signal; resetting a third latching circuit in response to the reset signal; and latching by the third latching circuit the logic output signal in response to the second edge of the clock signal to generate a reset synchronization control signal.

BRIEF DESCRIPTION OF THE DRAWINGS

For a better understanding of the embodiments, reference will now be made by way of example only to the accompanying figures in which.

DETAILED DESCRIPTION

Figure 1:
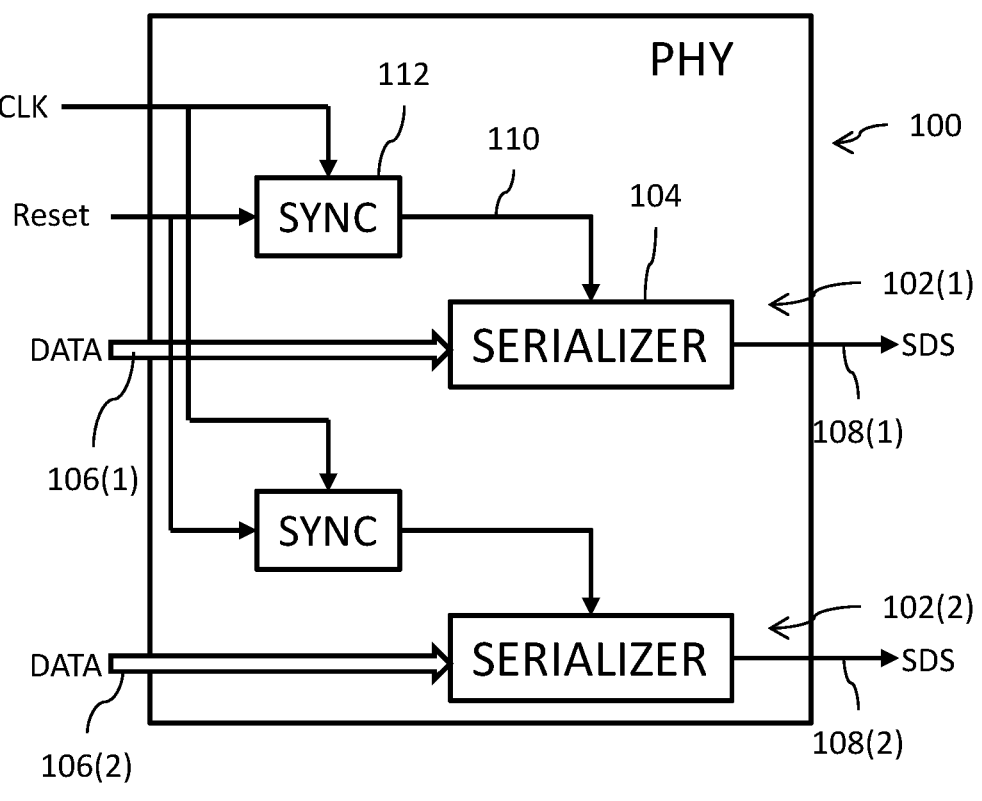
FIG. 1 is a high-level block diagram of a high-speed physical (PHY) layer 100 of a portion of a communications network.
Figure 4:
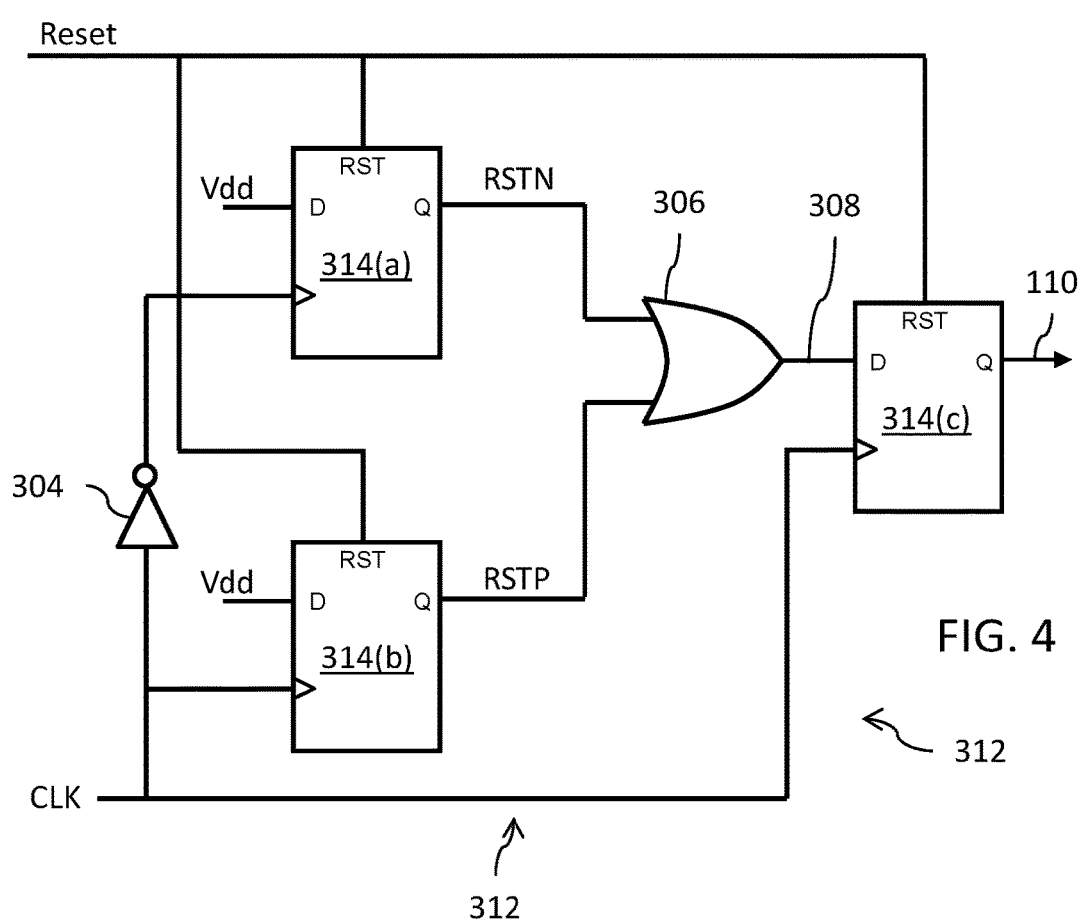
FIG. 4 is a block diagram of an embodiment for a reset synchronization circuit.

Reference is now made to FIG. 4 which shows a block diagram of an embodiment for a reset synchronization circuit 312 well suited for use as the reset synchronization circuit 112 in the PHY layer 100 of FIG. 1. The reset synchronization circuit 312 includes a first flip-flop circuit 314(a), functioning as a latching circuit, having a clock input configured to receive a logical inversion (through inverter circuit 304) of the high speed clock signal (CLK), for example at about a few giga-Hertz, and a reset input configured to receive the reset signal (Reset). The reset function of the first flip-flop circuit 314(a) is controlled by the reset signal (for example, reset to a logic low data output in response to a logic low state of the reset signal). The data input (D) of the first flip-flop circuit 314(a) is coupled to receive a logic 1 input signal (for example, by being tied to the supply voltage Vdd, for active low reset). The data output of the flip-flop circuit 314(a) is configured to output a first signal (RSTN). The reset synchronization circuit 312 further includes a second flip-flop circuit 314(b), functioning as a latching circuit, having a clock input configured to receive the clock signal (CLK) and a reset input configured to receive the reset signal (Reset). The reset function of the second flip-flop circuit 314(b) is controlled by the reset signal (for example, reset to a logic low data output in response to a logic low state of the reset signal). The data input (D) of the second flip-flop circuit 314(b) is coupled to receive a logic 1 input signal (for example, by being tied to the supply voltage Vdd). The data output of the flip-flop circuit 314(b) is configured to output a second signal (RSTP). This configuration of the first and second flip-flop circuits 314(a), 314(b) provides circuitry for latching the logic 1 input signal for generating signals RSTN, RSTP, respectively, on opposite (successive leading-trailing or trailing-leading) edges of the clock signal (CLK).

A combinational logic circuit 306 (comprising, for example, a logical OR gate) is configured to logically combine the first and second signals RSTN, RSTP to generate a logic output signal 308. A third flip-flop circuit 314(c), functioning as a latching circuit, has a clock input configured to receive the clock signal (CLK) and a reset input configured to receive the reset signal (Reset). The reset function of the third flip-flop circuit 314(c) is controlled by the reset signal (for example, reset to a logic low data output in response to a logic low state of the reset signal). The data input (D) of the third flip-flop circuit 314(c) is coupled to receive the logic output signal 308. The data output of the flip-flop circuit 314(c) is configured to generate the reset control signal 110. This configuration with the third flip-flop circuit 314(c) provides circuitry for latching the logic value of the logic output signal 308 in response to an edge (for example, the leading edge) of the clock signal (CLK).

In a preferred implementation, each of the flip-flop circuits 314 is a D-type flip-flop.

Although a two-input logical OR gate is illustrated by example for the combinational logic circuit 306 to process the signals RSTN, RSTP, it will be understood that other logic gates, or combinations of logic gates, may be implemented. The combinational logic circuit 306 may also be configured to logically combine the signals RSTN, RSTP with other signals for purposes of generating the reset control signal 110.

Reference is now made to FIGS. 5A-5D show timing diagrams for operation of the reset synchronization circuit 312 of FIG. 4. It will be noted that the timing diagrams have been simplified to omit gate and signal propagation delays.

Figure 5A:
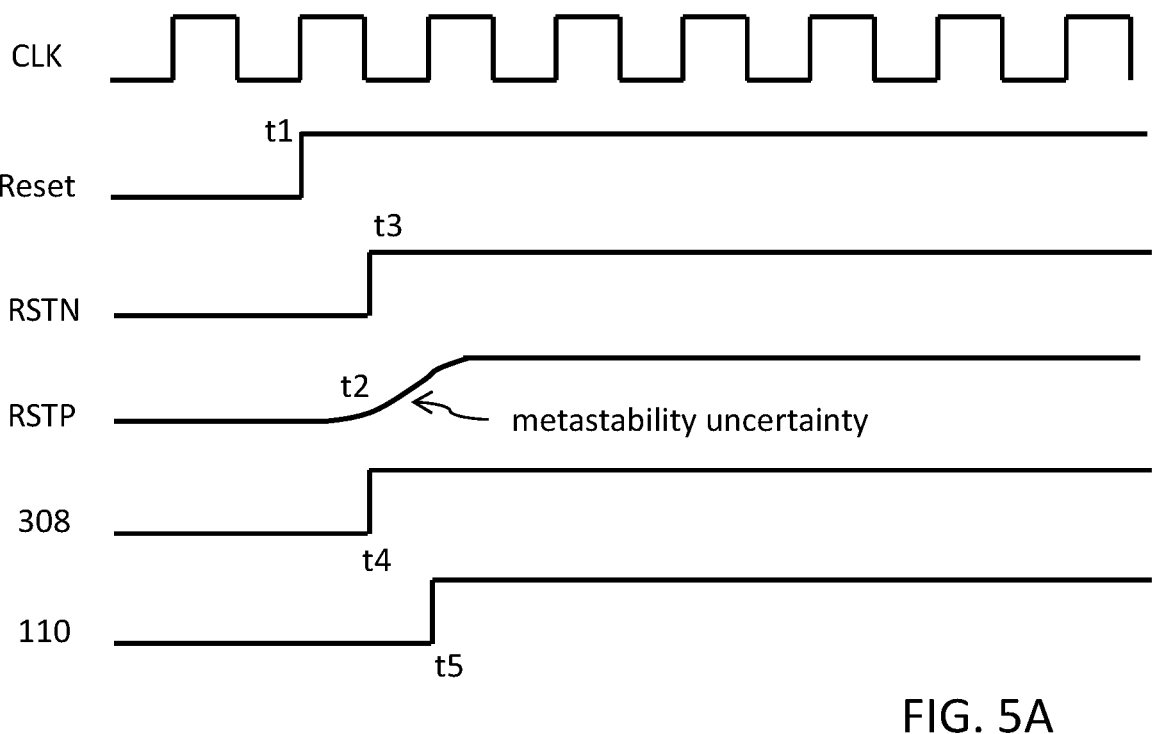
FIGS. 5A, 5B, 5C and 5D are timing diagrams for operation of the reset synchronization circuit of FIG. 4.

With reference to FIG. 5A, consider the situation where the change in state of the reset signal (Reset) occurs substantially simultaneously with the rising (leading) edge of the clock signal (CLK). This can result in a metastability condition in the second flip-flop circuit 314(*b*) with the second signal (RSTP) being in an unknown state at, and after, time t2. At the subsequent (i.e., immediately adjacent) falling (trailing) edge of the clock signal (CLK), because of the logic inversion provided by the inverter circuit 304, the first flip-flop circuit 314(*a*) latches the Vdd input signal at time t3 and the output first signal (RSTN) changes state. The logic OR gate logically combines the first and second signals RSTN, RSTP and asserts the logic output signal 308 to logic high in response to the logic high state of the first signal (RSTN) at time t4. In response to the rising (leading) edge of the next cycle of the clock signal (CLK), the third flip-flop circuit 314(*c*) latches the logic output signal 308 and asserts the reset control signal 110 at time t5.

Figure 5B:
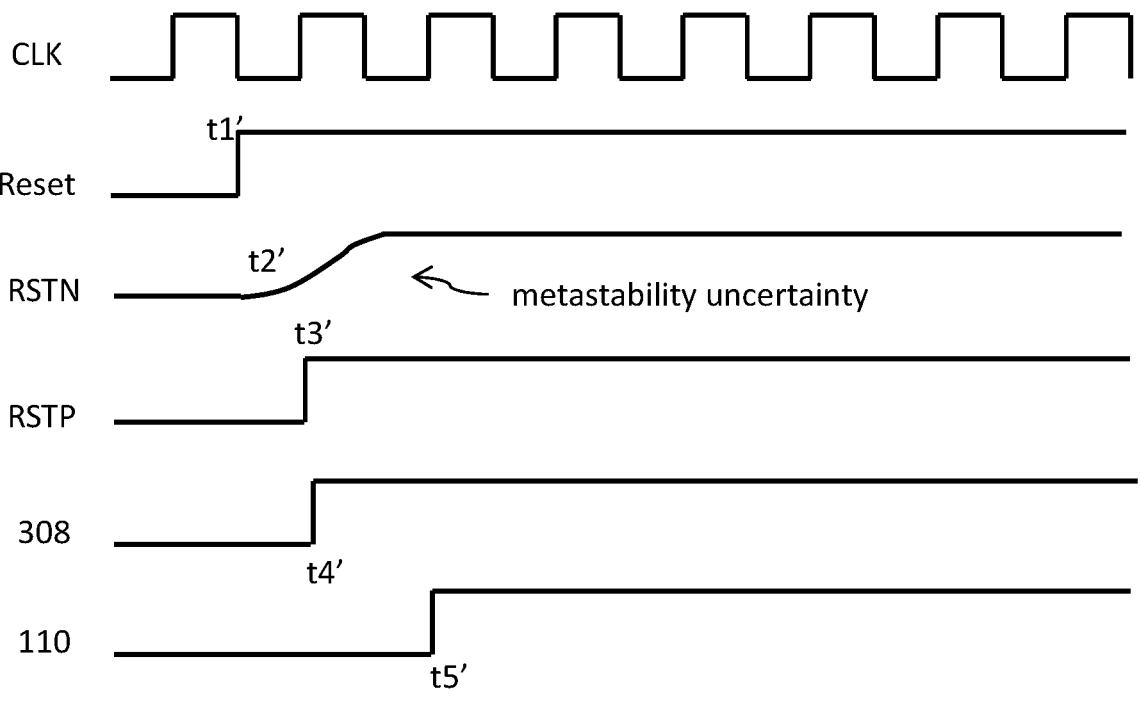

Turning to FIG. 5B, consider now the situation where the change in state of the reset signal (Reset) occurs simultaneously with the falling (trailing) edge of the clock signal (CLK) at time t1'. Note here that the inverter 304 will apply the logical inversion of the clock signal with a rising (leading) edge at the clock input of the first flip-flop circuit 314(*a*). This can result in a metastability condition in the first flip-flop circuit 314(*a*) with the first signal (RSTN) being in an unknown state at time t2'. At the subsequent (i.e., immediately adjacent) rising (leading) edge of the clock signal (CLK), the second flip-flop circuit 314(*b*) latches the Vdd input signal at time t3' and the second signal (RSTP) changes state. The logic OR gate logically combines the first and second signals RSTN, RSTP and asserts the logic output signal 308 to logic high in response to the logic high state of the second signal (RSTP) at time t4'. In response to the rising (leading) edge of the next cycle of the clock signal (CLK), the third flip-flop circuit 314(*c*) latches the logic output signal 308 and asserts the reset control signal 110 at time t5'.

It will be noted that time t5 and time t5' are synchronous with each other at the rising (leading) edge of the next cycle of the clock signal (CLK) following the clock cycle where the change in state of the reset signal (Reset) occurs. This timing is consistent in the presence of a metastability condition in either of the first and second flip-flop circuits 314(*a*), 314(*b*) (see, FIGS. 5A and 5B).

Figure 5C:
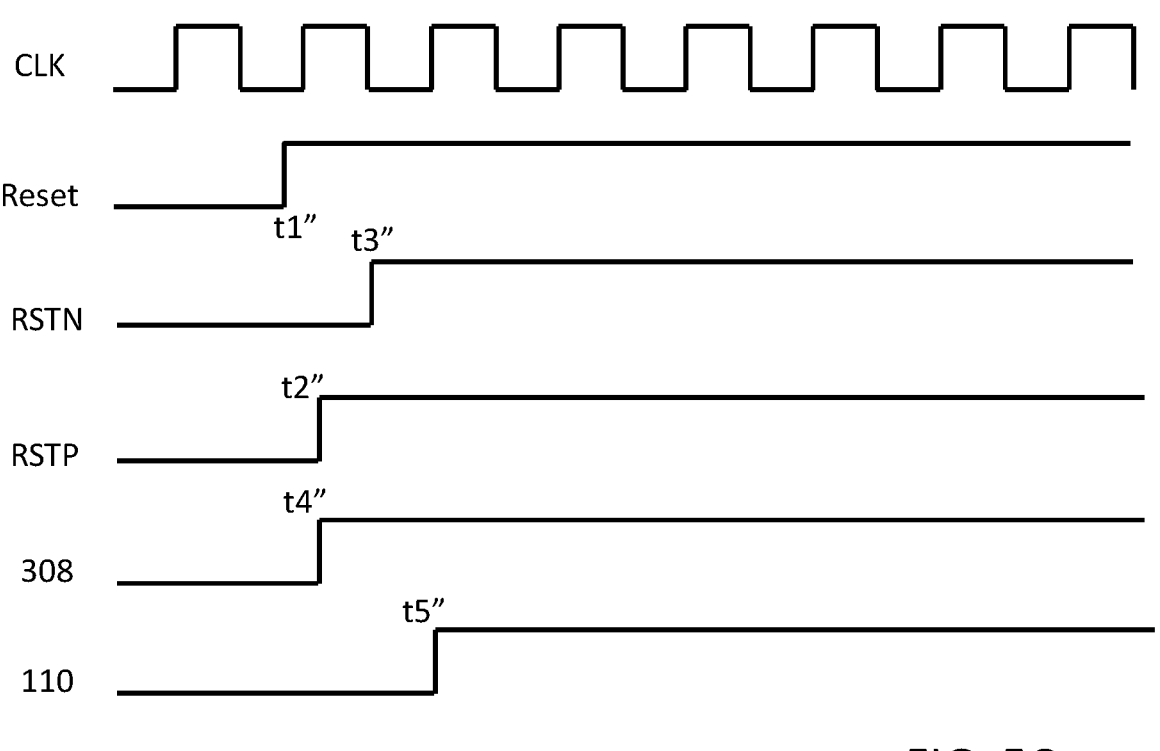
Figure 5D:
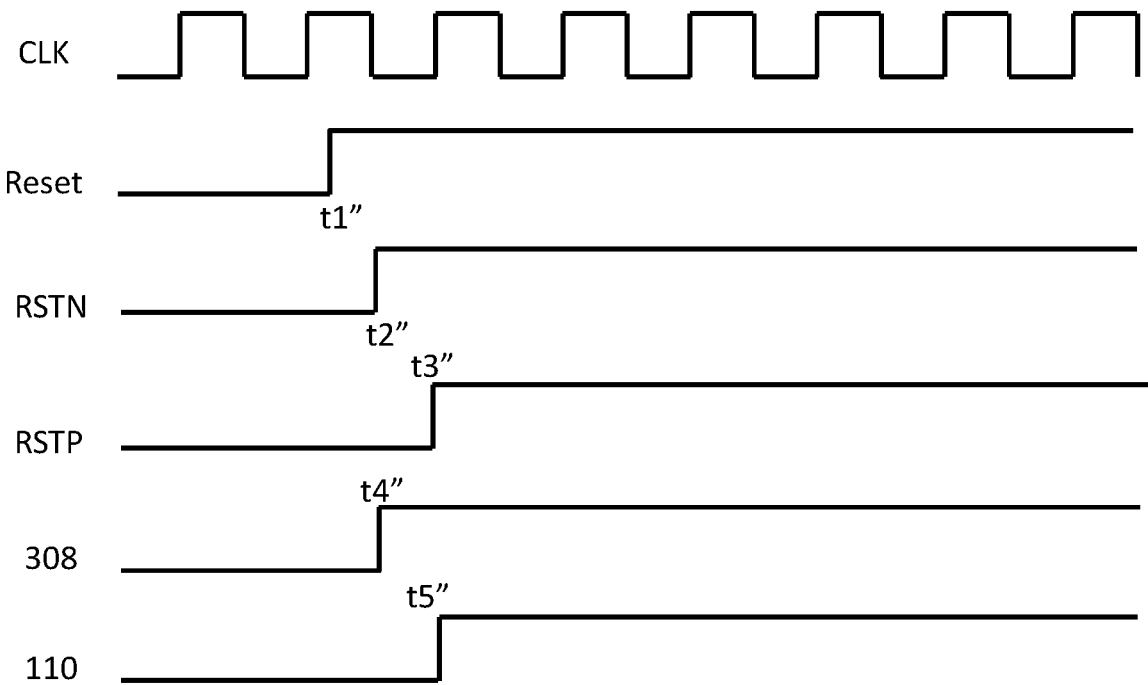

Additionally, this consistency in timing is present in the absence of any metastability condition (see, FIGS. 5C and 5D, where the change in state of the reset signal (Reset) occurs offset from any edge of the clock signal (CLK)). In the operation shown in FIG. 5C, consider the example where the change in state of the reset signal (Reset) occurs prior to the rising (leading) edge of clock signal (CLK) at time t1". At the rising edge of the clock signal (CLK), the second flip-flop circuit 314(*b*) latches the Vdd input signal at time t2' and the second signal (RSTP) changes state. At the subsequent falling (trailing) edge (i.e., immediately adjacent) of the clock signal (CLK), because of the logic inversion provided by the inverter circuit 304, the first flip-flop circuit 314(*a*) latches the Vdd input signal at time t3' and the first signal (RSTN) changes state. The logic OR gate logically combines the first and second signals RSTN, RSTP and asserts the logic output signal 308 to logic high in response to the logic high state of either of the first and second signals (RSTN, RSTP) at time t4". In response to the rising (leading) edge of the next cycle of the clock signal (CLK), the third flip-flop circuit 314(*c*) latches the logic output signal 308 and asserts the reset control signal 110 at time t5' (which is synchronous to times t5 and t5').

FIG. 5D illustrates the timing for circuit operation where the change in state of the reset signal (Reset) occurs after the rising (leading) edge of clock signal (CLK). At the falling (trailing) edge of the clock signal (CLK), because of the logic inversion provided by the inverter circuit 304, the first flip-flop circuit 314(*a*) latches the Vdd input signal at time t2' and the first signal (RSTN) changes state. At the subsequent (i.e., immediately adjacent) rising edge of the clock signal (CLK), the second flip-flop circuit 314(*b*) latches the Vdd input signal at time t3' and the second signal (RSTP) changes state. The logic OR gate logically combines the first and second signals RSTN, RSTP and asserts the logic output signal 308 to logic high in response to the logic high state of either of the first and second signals (RSTN, RSTP) at time t4". In response to the rising edge of the next cycle of the clock signal (CLK), the third flip-flop circuit 314(*c*) latches the logic output signal 308 and asserts the reset control signal 110 at time t5' (which is synchronous to times t5 and t5').

Figure 2:
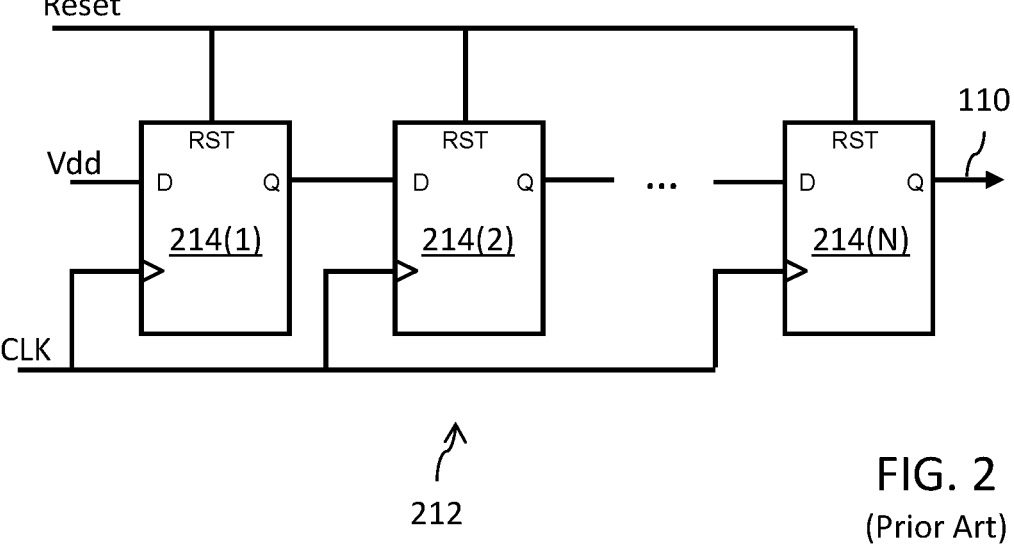
FIG. 2 is a block diagram of a prior art reset synchronization circuit.
Figure 3:
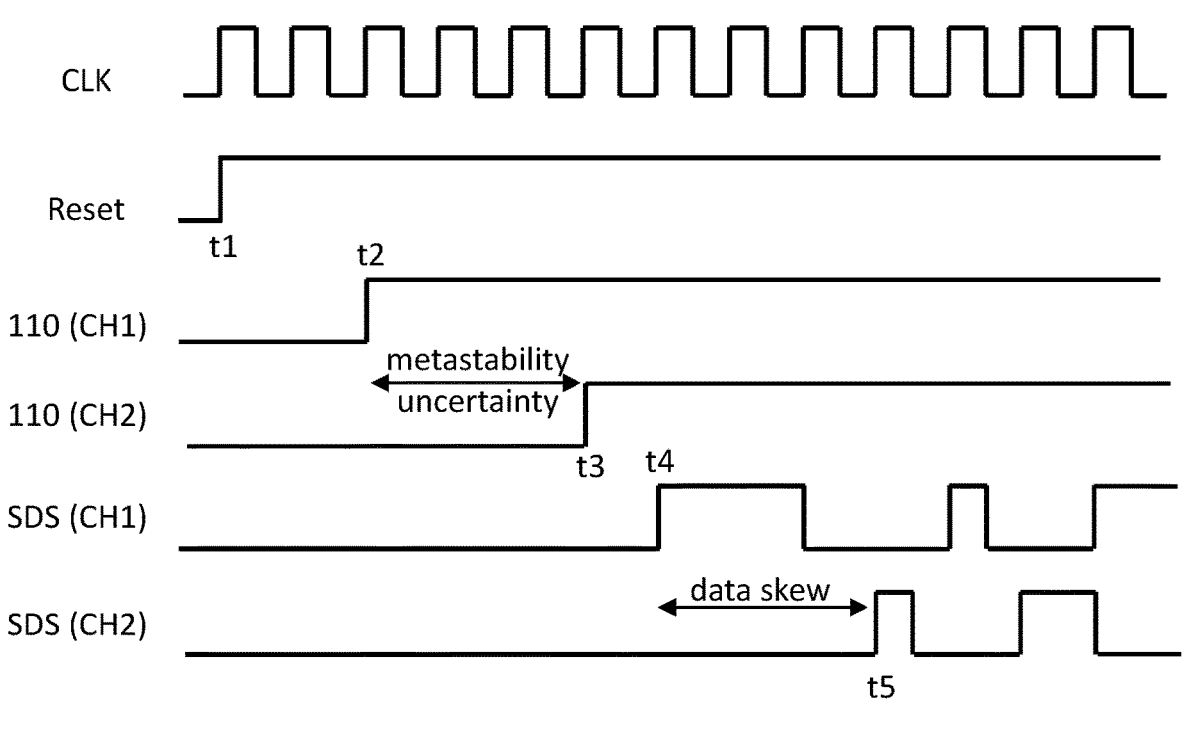
FIG. 3 is a timing diagram for operation of the PHY layer of FIG. 1 using the prior art reset synchronization circuits of FIG. 2.

Advantageously, the reset synchronization circuit 312 has a very low latency as shown by the short time duration in all operational modes of FIGS. 5A-5D from change in state of the reset signal (Reset) to assertion logic high of the logic output signal 308 which controls assertion of the reset control signal 110 at coincident times t5, t5', t5'. This performance presents a significant improvement over the prior art reset synchronization circuit 212 of FIG. 2. The worst case latency of the circuit 312 is fixed to about one-half a clock time period.

A further advantage of the reset synchronization circuit 312 is a reduction in the number of flip-flop circuits that are needed, along with a corresponding reduction in power consumption.

Figure 6:
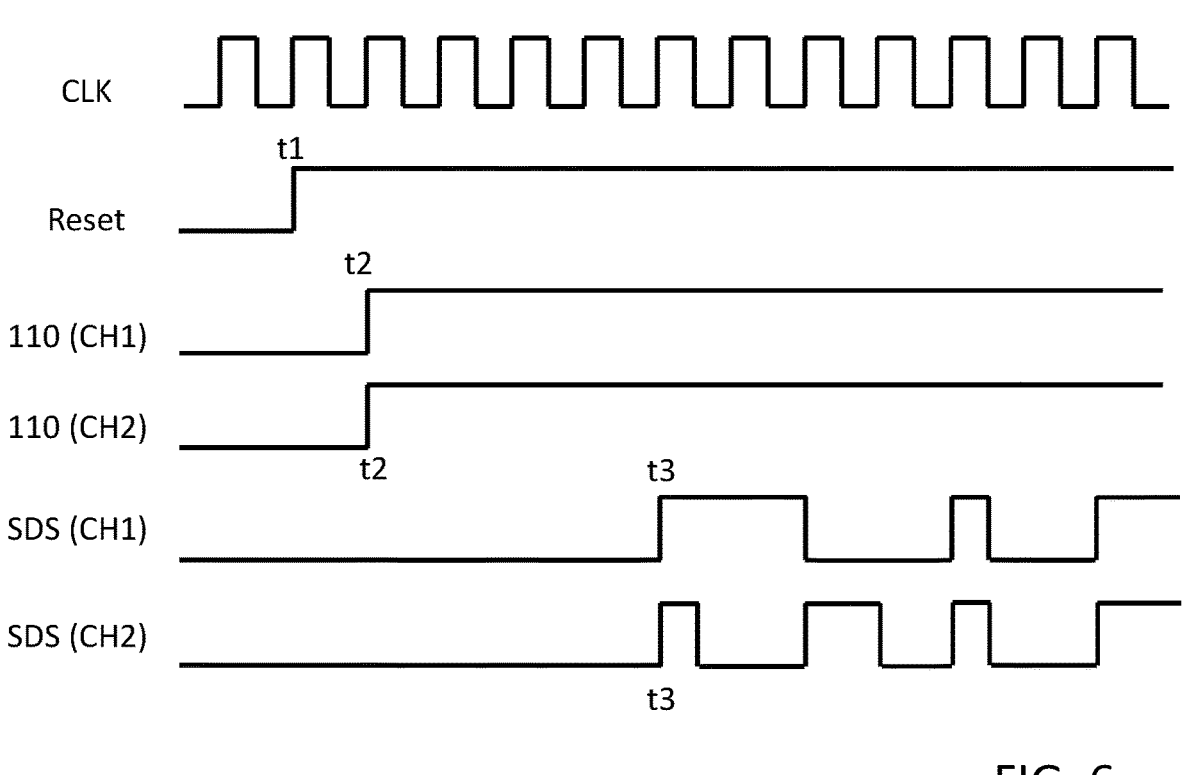
FIG. 6 is a timing diagram for operation of the PHY layer of FIG. 1 using the reset synchronization circuits of FIG. 4.

Reference is now made to FIG. 6 which shows a timing diagram for operation of the PHY layer 100 of FIG. 1 using the reset synchronization circuits 312 of FIG. 4. At time t1, a change in state of the reset signal (Reset) occurs simultaneously with the rising (leading) edge of the clock signal (CLK). A first reset synchronization circuit 312 associated with a first data communications channel 102(1) responds to the change in state of the reset signal (Reset) by asserting the reset control signal 110 (CH1) for the serializer circuit 104 of the first data communications channel 102(1) at time t2. Note, this timing holds true whether there any issue with a metastability condition in either of the flip-flop circuits 314(*a*), 314(*b*). A second reset synchronization circuit 312 associated with a second data communications channel 102(2) responds to the change in state of the reset signal (Reset) by asserting the reset control signal 110 (CH2) for the serializer circuit 104 of the second data communications channel 102(2) also at time t2. Note, this timing holds true whether there any issue with a metastability condition in either of the flip-flop circuits 314(*a*), 314(*b*). At time t3, because the reset control signals 110 for the serializer circuits 104 of both data communications channels 102 (CH1 and CH2) were synchronized, there is a synchronous start of serial data stream (SDS) output from the serializer circuits 104 of the first and second data communications channels 102(1), 102(2).

Figure 7:
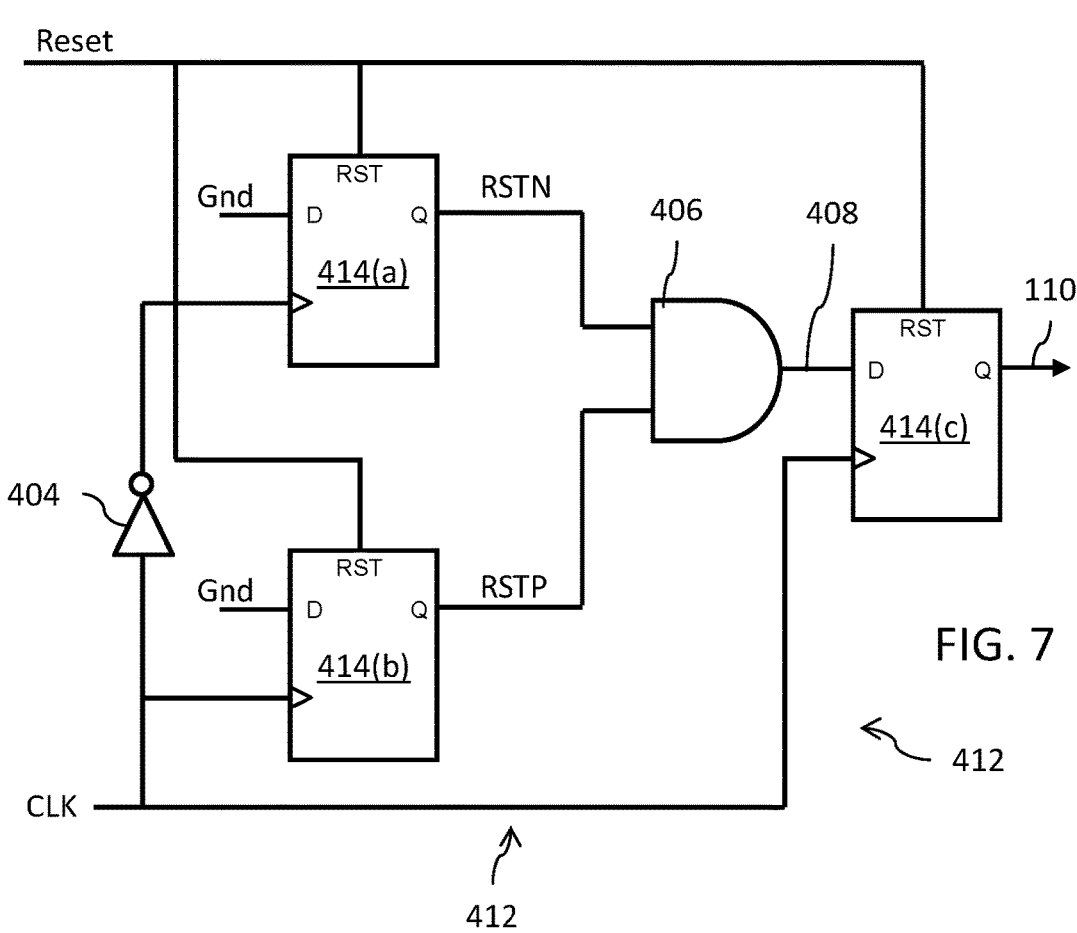
FIG. 7 is a block diagram of an alternative embodiment for a reset synchronization circuit.

Reference is now made to FIG. 7 which shows a block diagram of an alternative embodiment for a reset synchronization circuit 412 well suited for use as the reset synchronization circuit 112 in the PHY layer 100 of FIG. 1. The reset synchronization circuit 412 includes a first flip-flop circuit 414(*a*), functioning as a latching circuit, having a clock input configured to receive a logical inversion (through inverter circuit 404) of the high speed clock signal (CLK), for example at about a few giga-Hertz, and a reset input configured to receive the reset signal (Reset). The reset function of the first flip-flop circuit 414(*a*) is controlled by the reset signal (for example, reset to a logic high data output in response to a logic high state of the reset signal). The data input (D) of the first flip-flop circuit 414(*a*) is coupled to receive a logic 0 input signal (for example, by being tied to the supply voltage Gnd, for active high reset). The data output of the flip-flop circuit 414(*a*) is configured to output a first signal (RSTN). The reset synchronization circuit 412 further includes a second flip-flop circuit 414(*b*), functioning as a latching circuit, having a clock input configured to receive the clock signal (CLK) and a reset input configured to receive the reset signal (Reset). The reset function of the second flip-flop circuit 414(*b*) is controlled by the reset signal (for example, reset to a logic high data output in response to a logic high state of the reset signal). The data input (D) of the second flip-flop circuit 414(*b*) is coupled to receive a logic 0 input signal (for example, by being tied to the supply voltage Gnd). The data output of the flip-flop circuit 414(*b*) is configured to output a second signal (RSTP). This configuration of the first and second flip-flop circuits 414(*a*), 414(*b*) provides circuitry for latching the logic 0 input signal for generating signals RSTN, RSTP, respectively, on opposite edges of the clock signal (CLK).

A combinational logic circuit 406 (comprising, for example, a logical AND gate) is configured to logically combine the first and second signals RSTN, RSTP to generate a logic output signal 408. A third flip-flop circuit 414(*c*), functioning as a latching circuit, has a clock input configured to receive the clock signal (CLK) and a reset input configured to receive the reset signal (Reset). The reset function of the third flip-flop circuit 414(*c*) is controlled by the reset signal (for example, reset to a logic high data output in response to a logic high state of the reset signal). The data input (D) of the third flip-flop circuit 414(*c*) is coupled to receive the logic output signal 408. The data output of the flip-flop circuit 414(*c*) is configured to generate the reset control signal 110. This configuration with the third flip-flop circuit 414(*c*) provides circuitry for latching the logic value of the logic output signal 408 in response to the rising (leading) edge of the clock signal (CLK).

In a preferred implementation, each of the flip-flop circuits 414 is a D-type flip-flop.

Although a two-input logical AND gate is illustrated by example for the combinational logic circuit 406 to process the signals RSTN, RSTP, it will be understood that other logic gates, or combinations of logic gates, may be implemented. The combinational logic circuit 406 may also be configured to logically combine the signals RSTN, RSTP with other signals for purposes of generating the reset control signal 110.

The reset synchronization circuit 412 operates in a manner similar to that of the reset synchronization circuit 312 as shown in FIGS. 5A-5D except that the logic states of the signals are inverted.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A reset synchronization circuit, comprising:
a first latching circuit having a reset function controlled by a reset signal and configured to latch a logic state in response to a first edge of a clock signal to generate a first output signal;

a second latching circuit having a reset function controlled by said reset signal and configured to latch a logic state in response to a second edge of said clock signal to generate a second output signal;
wherein the first and second edges are opposite edges;
a combinatorial logic circuit configured to logically combine the first and second output signals to generate a logic output signal; and
a third latching circuit having a reset function controlled by said reset signal and configured to latch the logic output signal in response to said second edge of said clock signal to generate a reset synchronization control signal.

2. The reset synchronization circuit of claim 1, wherein each of the first, second and third latching circuits comprises a flip-flop circuit.

3. The reset synchronization circuit of claim 2, wherein the flip-flop circuit is a D-type flip-flop.

4. The reset synchronization circuit of claim 3, wherein each of the D-type flip-flop of the first and second latching circuits has a data input coupled to receive a supply voltage and wherein the combinatorial logic circuit is a logical OR gate receiving the first and second output signals at inputs and generating the logic output signal at an output.

5. The reset synchronization circuit of claim 3, wherein each of the D-type flip-flop of the first and second latching circuits has a data input coupled to receive a ground voltage, and wherein the combinatorial logic circuit is a logical AND gate receiving the first and second output signals at inputs and generating the logic output signal at an output.

6. The reset synchronization circuit of claim 1, wherein the first and second edges are adjacent edges of the clock signal.

7. The reset synchronization circuit of claim 1, wherein the clock signal has a giga-Hertz frequency.

8. A physical layer within a communications network, comprising:
a first data communications channel having a first serializer circuit with an input coupled to a first data bus and an output coupled to a first serial data line;
a second data communications channel having a second serializer circuit with an input coupled to a second data bus and an output coupled to a second serial data line;
a first reset synchronization circuit configured to receive a reset signal and a clock signal and having an output configured to generate a first reset control signal applied for controlling resetting of the first serializer circuit; and
a second reset synchronization circuit configured to receive said reset signal and said clock signal and having an output configured to generate a second reset control signal applied for controlling resetting of the second serializer circuit;
wherein each of the first and second reset synchronization circuits comprises:
a first latching circuit having a reset function controlled by said reset signal and configured to latch a logic state in response to a first edge of said clock signal to generate a first output signal;
a second latching circuit having a reset function controlled by said reset signal and configured to latch a logic state in response to a second edge of said clock signal to generate a second output signal;
wherein the first and second edges are opposite edges;
a combinatorial logic circuit configured to logically combine the first and second output signals to generate a logic output signal; and a third latching circuit having a reset function controlled by said reset signal and configured to latch the logic output signal in response to said second edge of said clock signal to generate the corresponding one of the first and second reset control signals.

9. The physical layer of claim 8, wherein each of the first, second and third latching circuits of the reset synchronization circuit comprises a flip-flop circuit.

10. The physical layer of claim 9, wherein the flip-flop circuit is a D-type flip-flop.

11. The physical layer of claim 10, wherein each of the D-type flip-flop of the first and second latching circuits has a data input coupled to receive a supply voltage and wherein the combinatorial logic circuit is a logical OR gate receiving the first and second output signals at inputs and generating the logic output signal at an output.

12. The physical layer of claim 10, wherein each of the D-type flip-flop of the first and second latching circuits has a data input coupled to receive a ground voltage, and wherein the combinatorial logic circuit is a logical AND gate receiving the first and second output signals at inputs and generating the logic output signal at an output.

13. The physical layer of claim 8, wherein the first and second edges are adjacent edges of the clock signal.

14. The physical layer of claim 1, wherein the clock signal has a giga-Hertz frequency.

15. A reset synchronization method, comprising:
resetting a first latching circuit in response to a reset signal;
latching by the first latching circuit a logic state in response to a first edge of a clock signal;
resetting a second latching circuit in response to the reset signal;
latching by the second latching circuit a logic state in response to a second edge of the clock signal;
wherein the first and second edges are opposite edges;
logically combining an output of the first latching circuit with an output of the second latching circuit to generate a logic output signal;
resetting a third latching circuit in response to the reset signal; and
latching by the third latching circuit the logic output signal in response to the second edge of the clock signal to generate a reset synchronization control signal.

16. The method of claim 15, wherein the first and second edges are adjacent edges of the clock signal.

17. The method of claim 15, wherein the clock signal has a giga-Hertz frequency.

18. The method of claim 15, wherein the logically combining is logically OR-ing.

19. The method of claim 15, wherein the logically combining is logically AND-ing.

* * * * *